United States Patent [19]

Yablonovitch

[11] Patent Number: 4,525,593
[45] Date of Patent: Jun. 25, 1985

[54] INVERTED, OPTICALLY ENHANCED SOLAR CELL

[75] Inventor: Eli Yablonovitch, Scotch Plains, N.J.

[73] Assignee: Exxon Research and Engineering Co., Florham Park, N.J.

[21] Appl. No.: 601,080

[22] Filed: Apr. 16, 1984

[51] Int. Cl.³ .............................................. H01L 31/06
[52] U.S. Cl. .................................... 136/255; 136/244; 136/256; 136/258; 357/30
[58] Field of Search ................. 136/255, 258 PC, 256, 136/261; 357/30

[56] References Cited

U.S. PATENT DOCUMENTS 4,315,097 2/1982 Solomon .............................. 136/255

Primary Examiner—Aaron Weisstuch
Attorney, Agent, or Firm—Ronald D. Hantman

[57] ABSTRACT

An ultra-high efficiency inverted solar cell structure is disclosed. At the rear of the cell is a high performance heterocontact made of SIPOS (a mixture of micro-crystalline silicon and silicon dioxide). At the edge of the cell, the opposite contact is of conventional heavily doped silicon. The edge contact is kept in the dark at least one diffusion length or one-third mm laterally displaced away from both the active illuminated region and from the active heterocontact.

11 Claims, 5 Drawing Figures

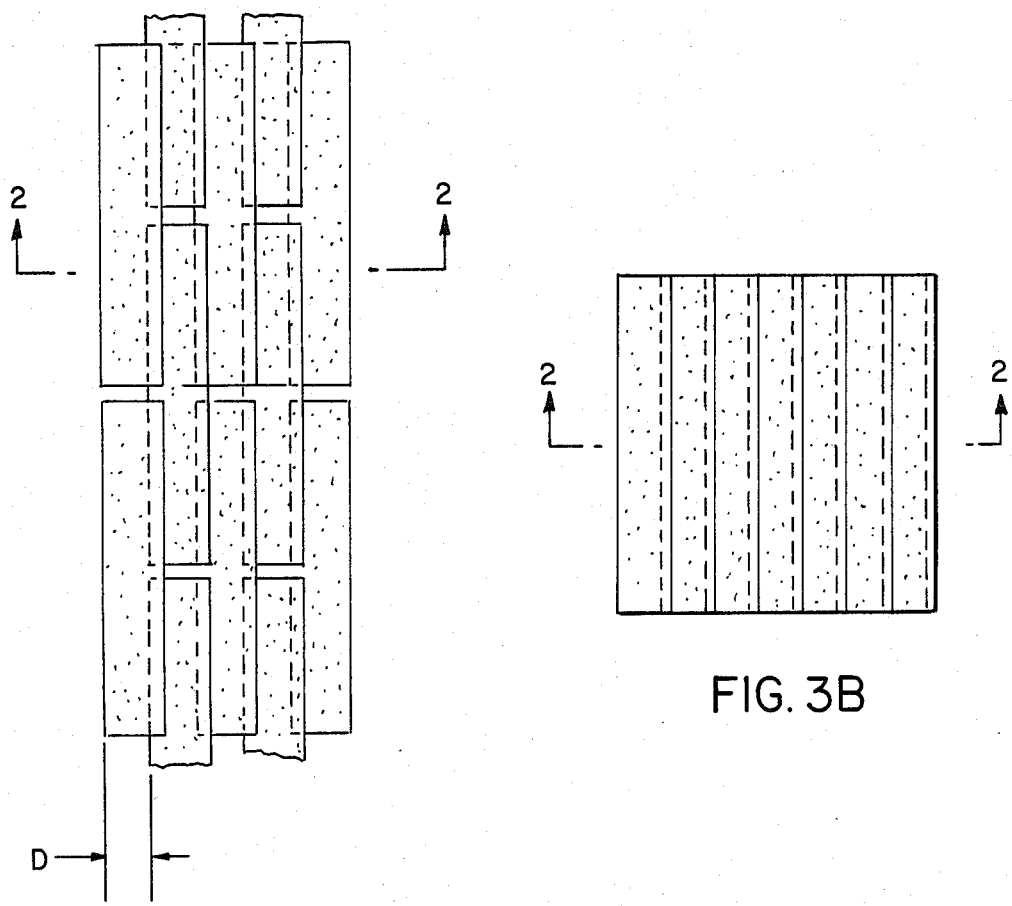
FIG. 3B
FIG. 3A
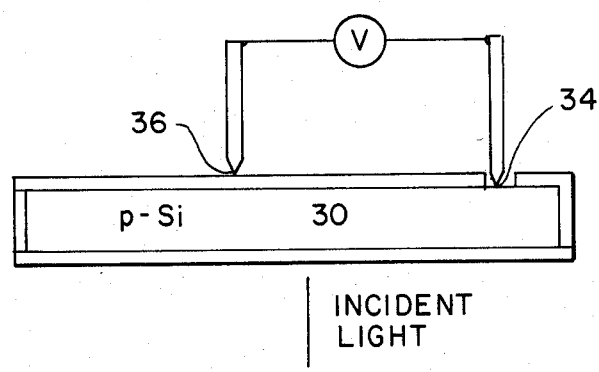
FIG. 4

INVERTED, OPTICALLY ENHANCED SOLAR CELL

BACKGROUND OF THE INVENTION

This invention relates to inverted solar cell structures in which the active inversion layer is at the rear of the solar cell away from the incident light direction.

A photovoltaic cell is a device that directly converts photon radiant energy into electrical energy. In a photovoltaic device, photons of sufficient energy react with a semiconductor material to produce positive and negative charge carriers, electrons and holes which can move freely throughout the semiconductor. The object of the device is to collect electrons at one electrical contact and holes at the other electric contact, before they recombine, either at the contacts themselves, elsewhere on the surface, or in the bulk of the semiconductor. To cause these free charge carriers to flow selectively to their respective contacts, the contacts must form a barrier to one type of carrier and permit the opposite carrier to pass freely. Until recently, the most effective selective barrier have been p-n junctions which are formed at the interface between p-type and n-type impurity contained regions of the semiconductor.

If the bulk silicon is of very high quality most of the recombination will occur at the surfaces, especially at the contacts. Conventional doped semiconductor contacts which are used to produce p-n junctions are relatively inferior in this respect. This type of recombination is usually measured in terms of the forward leakage current symbolized as $J_o$. Recently, it has been shown that bipolar transistors with improved current gain can be produced by making hetero junction emitters of n-type doped SIPOS (Semi-Insulating Polysilicon, a mixture of microcrystalline silicon and silicon dioxide), see e.g. T. Matsushita, N. Ohuchi, H. Hayoshi, and H. Yamoto, *Appl. Phys. Lett.*, Vol. 35, No. 7, (1979). This implies that they had improved the forward leakage current of the emitter. Values of $J_o$ as low as $10^{-14}$ Amps/cm$^2$ have recently been achieved with this type of heterocontact, which is about two orders of magnitude superior to a conventional p-n junction.

SUMMARY OF THE INVENTION

The photovoltaic cell of this invention is an inverted solar cell with a SIPOS heterojunction at the rear and a conventional Si heavily doped contact at the edge. The Si conventional contact is shadowed and kept at least one-diffusion length or one-third millimeter laterally displaced away from both the active illuminated region and from the active heterocontact. Surfaces which do not include either the SIPOS heterocontact or the conventional Si heavily doped contact are oxidized in order to maintain a low surface recombination velocity.

BRIEF DESCRIPTION OF THE INVENTION

FIG. 1 is a cross-sectional view of an individual silicon cell of the present invention. The front of the cell may be textured to help trap the light internally and to reduce reflection losses.

FIG. 2 is a cross-sectional view of the arrangement of the individual cells of FIG. 1 into a panel of solar cells. A series metallic connection is made between the p+-Si contact on the edge of one ribbon with the n+-SIPOS metallization of the adjacent rib bon. Thereby an integrated high voltage series connection is established for the panel. In addition, the p+-Si contact is shaded by the adjacent ribbon as is required in order to minimize recombination at the contact.

FIGS. 3A and 3B show the top view of the series connection of the individual cells. The dashed lines represent the hidden edge of the silicon cell which is the p+-Si edge contact. FIG. 3(a) shows a staggered series-parallel connection while FIG. 3(b) shows a simple series-string electrical connection.

FIG. 4 shows simple test structure used to generate a record voltage thereby demonstrating the superior leakage current of the n+-SIPOS hereto-contact.

DETAILED DESCRIPTION OF THE INVENTION

The solar cell of the present invention shall be illustrated and described by a cell with p doped crystalline silicon and n-doped SIPOS. It is to be understood that the doping types may be interchanged.

FIG. 1 shows a schematic diagram of a solar cell constructed according to the present invention. The cell includes a thin ribbon of p-type silicon. The cell is also an inverted solar cell, that is, the depletion layer is at the rear of the cell, away from the incident light.

Being a thin cell, it is desirable that the cell be optically enhanced. A thin slar cell can collect current very efficiently if it is optically enhanced, permitting the light to be trapped internally by total internal reflection. In addition, material usage is very small in a thin cell. The property of being thin permits an additional important attribute. The depletion layer of the cell may be placed at the rear forming an inverted structure. This is permissible, because in a cell much thinner than a diffusion length, those carriers which are generated at the front surface can diffuse to the rear depletion layer with few recombination losses along the way.

There are advantages to placing the depletion layer at the rear of an optically enhanced cell. The n-type region on the narrow side of the depletion layer is in need of excellent sheet conductivity. If it were at the front of the solar cell a transparent conductor and a grid would be required, compromising the optical transmission as well as the optical enhancement. By placing the n-type hetero-contact at the bottom of the cell, a continuous metal film can provide good sheet conductivity and good optical reflectivity which is important to optical enhancement.

In addition, no transparent conductor is required for the front surface since the semiconductor layer itself can provide its own sheet conductivity in front of the depletion layer. However, an anti-reflection coating is desirable, and is assisted by the front surface texturing which is essential for optical enhancement (light trapping) in any case. The elimination of the transparent conductor permits excellent blue response, eliminates grid transmission losses, and eliminates the small parasitic absorption which competes with optical enhancement (light trapping). Furthermore, the sheet conductivity of the semiconductor ribbon is generally superior to that of semitransparent conducting films, reducing resistive losses to the electrical current.

The advantage of the n+-SIPOS hetero-contact 20 over the conventional p-n junction has already been discussed above, due to its superior (small) forward leakage current $J_o$. The opposite contact in FIG. 1 is a conventional heavily doped p+-Si contact 26. By placing that contact in the dark at one edge of the cell some distance from the active region, that contact's poor qualities can be greatly ameliorated. FIG. 2 shows how the individual ribbons of FIG. 1 must be stacked in order to shade the heavily p+ doped contact. Since the contact is in the dark there will be few minority carriers (electrons) available to recombine at that contact. Furthermore, since the contact is one-third of a millimeter away from the active illuminated region and the active n+-SIPOS heterocontact, minority carriers would have to diffuse that full lateral distance of one-third millimeter in order to recombine. Therefore, that one-third millimeter dark space acts as a barrier to recombination and greatly increases the effectiveness of the p+ contact in reducing its forward leakage current. Under these conditions, the effectiveness of the p+-Si contact and the n+-SIPOS heterocontact are both similar and excellent, allowing an increased efficiency and open circuit voltages over 720 milli-volts.

In general, the minority carrier diffusion length of the crystalline silicon is greater than 200 um and the minority carrier lifetime is greater than 40 u sec.

The specifications of the crystalline silicon ribbon material used in a specific example were as follows:

| | |
|---|---|
| doping | $10^{17}/cm^3$ Boron |
| minority carrier lifetime | 111 μsec |
| minority carrier mobility | 400 $cm^2$/volt-sec |
| minority carrier diffusion length | 333 μm |
| thickness | 50 μm |
| width | 2.33 mm |
| length | 10 cm |
| $J_o$ of n+-SIPOS heterocontact | $10^{-14}$ Amps/$cm^2$ |
| surface recombination velocity of $SiO_2$ | 5 cm/sec |
| anti-reflection coating | 97.5% |

The front surface 12 of the silicon ribbon is textured to improve the anti-reflection properties and to randomize the internal direction of the incident light to effect light trapping by total internal reflection (optical enhancment). The front surface is covered by a layer of silicon dioxide 10 which is thermally grown to produce a low surface recombination velocity at the interface 12 between the $SiO_2$ 10 and the p-Si ribbon 14. The interface 12 has a surface recombination velocity of 5 cm/sec which can be expected by those skilled in the art of thermal oxidation. To this end, it may be desirable for the interfacial fixed charge at the interface 12 to be negative in order to produce a slight degree of accumulation of holes at those surfaces 12. All surfaces which are not contacted by either of n+-SIPOS or p+-Si should be covered by such a high quality oxide 10. This includes the right hand edge of the ribbon (as shown in FIG. 1) as well as the one-third mm wide space at the left bottom of the ribbon in between the p+-Si contact 26 and the n+-SIPOS heterocontact 20.

The bulk of the ribbon 14 comprises a p-type conductivity layer. The dashed line 16 represents the depletion layer in which the conductivity type changes from p-type to n-type due to proximity to the n+-SIPOS heterocontact. The interface 18 between the silicon ribbon 14 and the n+-SIPOS heterocontact contains a 20-40 Å interfacial layer of silicon dioxide which is so thin as to be permeable to electrons. The heterocontact layer of length D comprises n-type SIPOS, a mixture microcrystalline silicon and silicon dioxide, which is doped by phosphorus. A layer of highly reflective metal 22 such as silver or copper makes negative contact to the n+-SIPOS layer. The interface 24 between the n+-SIPOS and the metal may have a tiny amount of titanium or other metal present to assist forming the ohmic contact. At the left edge of the ribbon is the p+-Si layer 26 which is laterally displaced by one-third mm from the active region. Contacting the p+-SI is the positive metal contact 28.

The individual cells of FIG. 1 may be combined into a solar cell array. FIG. 2 shows a cross section of an arrangement of the silicon ribbon cells joined together so as to overlap a distance d. In this array, the p+-Si contacts 26 as well as the adjacent one-third millimeter region are kept in shade. Series connection metallization 32 makes electrical contact from the p+-Si contact at the left edge of one ribbon to the n+-SIPOS contact at the bottom of the adjacent ribbon. The individual repeating units of FIG. 2 may be repeated as many times as required to produce the desired output voltage from the far left edge to the far right edge of the series string.

FIG. 3 shows two embodiments of a top view of how the 10 cm long ribbons may be arranged in a panel to produce either a staggered series parallel connection (FIG. 3(a)) or a simple series string connection (FIG. 3(b)). The staggered connection (a) provides for a somewhat more redundant configuration since each ribbon is contacted by four others.

FIG. 4 shows a test configuration which we used to check the n+-SIPOS heterocontact performance parameters of the solar cell design described herein.

For this test, crystalline p-Si was covered with n+-SIPOS except for a small area 34. With light intensity equivalent to one sun intensity at a temperature of about 25° C., the voltage between the two points 34 and 36 was measured.

Figure 1:
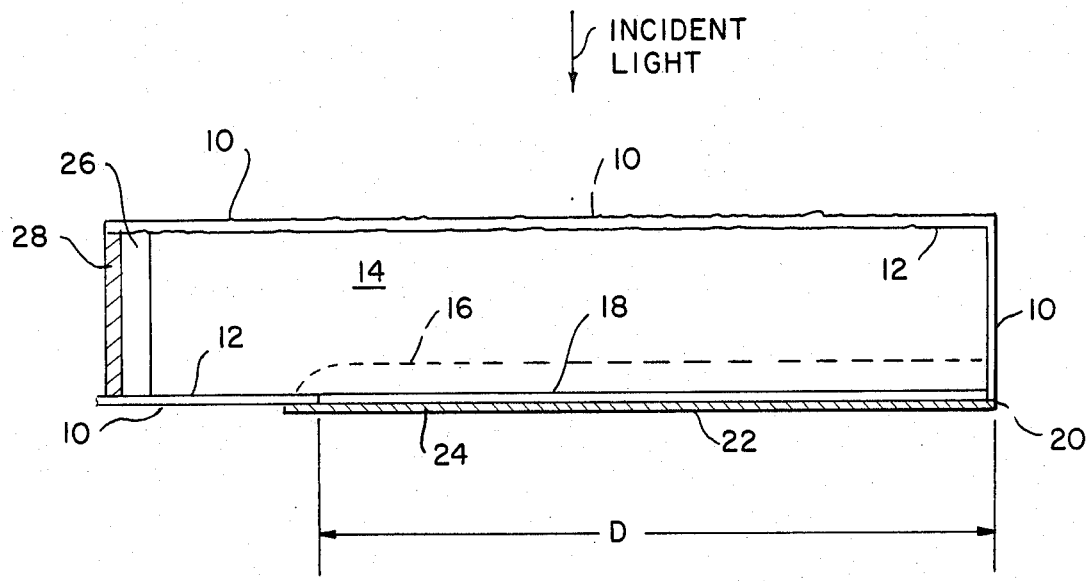
Figure 2:
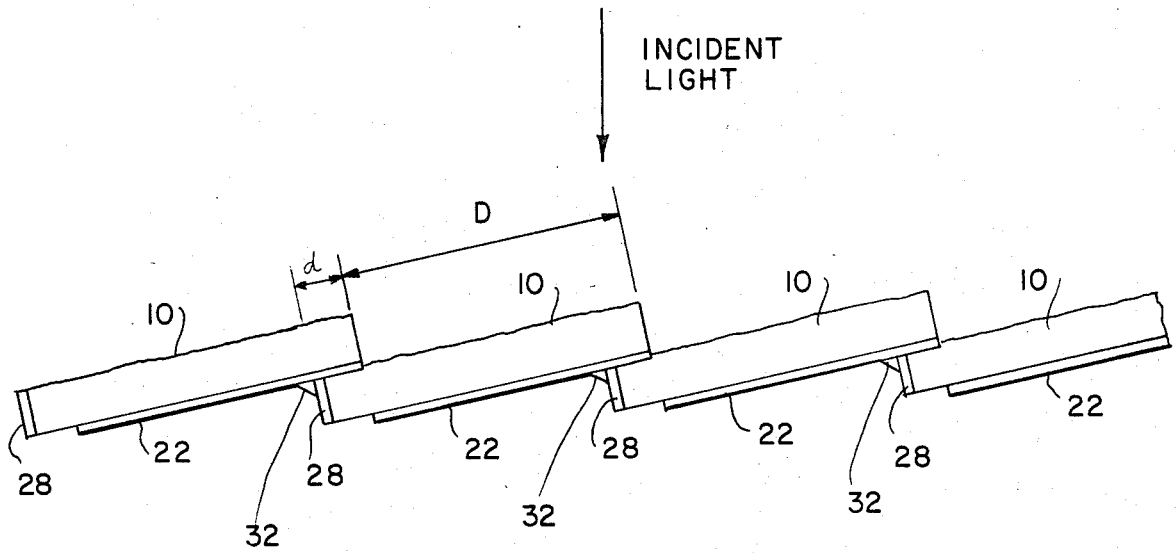

This configuration is useful for testing the low forward leakage current $J_o$ of the n+-SIPOS heterocontact. In this case both contacts were fully illuminated rather than one being kept in the dark as required for the solar cell described in FIG. 1. This is permissible for an open circuit voltage measurement since the sheet resistivity of the SIPOS layer is sufficiently high that the small amount of leakage is only a minor perturbation of open circuit conditions. In the test configuration of FIG. 4, a record open circuit voltage greater than 720 mV at air mass one was achieved. This is consistent with a forward leakage current $J_o=10^{-14}$ Amps/$cm^2$. This low value for $J_o$ was also confirmed by photoconductivity lifetime measurements.

What is claimed is:
1. A solar cell comprising:
 (a) an active material including a layer of crystalline silicon doped with one conductivity type dopant, a layer of SIPOS doped with the opposite conductivity type dopant deposited on at least one portion of the surface of said layer of crystalline silicon away from the incident light;
 (b) a first metal contact fixed to said layer of SIPOS; and
 (c) a second metal contact fixed to a portion of the edge of said layer of crystalline silicon, the region of said layer of crystalline silicon adjacent to said second metal contact being heavily doped with a greater concentration of said one conductivity type dopant than the remainder of said layer of crystalline silicon.

2. The solar cell of claim 1 wherein the minority carrier diffusion length of said crystalline silicon is greater than 200 $\mu$m.

3. The solar cell of claim 1 wherein the minority carrier lifetime is greater than 40 $\mu$sec.

4. The solar cell of claim 1 wherein the surfaces of said remainder of said crystalline silicon layer are passivated with $SiO_2$.

5. The solar cell of claim 1 wherein the heavily doped region adjacent to said second metal contact is laterally displaced from the opposite conductivity type SIPOS layer by a distance greater than one diffusion length.

6. The solar cell of claim 1 wherein the heavily doped region adjacent so said second metal contact is laterally displaced from the opposite conductivity type SIPOS layer by a distance greater than about 200 $\mu$m.

7. The solar cell of claim 1 wherein the heavily doped region adjacent to said second metal contact is not illuminated by direct incident light.

8. The solar cell of claim 1 wherein the heavily doped region adjacent to said second metal contact is maintained in a dark space.

9. The solar cell of claim 8 wherein said dark space is greater than one diffusion length.

10. The solar cell of claim 8 wherein said dark space is greater than about 200 $\mu$m.

11. The solar cell of claim 1 wherein the surface of said crystalline silicon toward the incident light is textured to produce light trapping and optical enhancment.

* * * * *